US006940107B1

(12) United States Patent
Cheng et al.

(10) Patent No.: US 6,940,107 B1
(45) Date of Patent: Sep. 6, 2005

(54) FUSE STRUCTURES, METHODS OF MAKING AND USING THE SAME, AND INTEGRATED CIRCUITS INCLUDING THE SAME

(75) Inventors: Chuan-Cheng Cheng, Fremont, CA (US); Shuhua Yu, Cupertino, CA (US); Roawen Chen, San Jose, CA (US); Albert Wu, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/734,779

(22) Filed: Dec. 12, 2003

(51) Int. Cl.[7] ............................................. H01L 27/10
(52) U.S. Cl. ..................... 257/209; 257/529; 257/530
(58) Field of Search ............................. 257/209, 529, 257/530

(56) References Cited

U.S. PATENT DOCUMENTS

| 4,795,720 | A | * | 1/1989 | Kawanabe et al. ......... 438/759 |
| 4,920,075 | A | | 4/1990 | Morita |
| 5,872,390 | A | | 2/1999 | Lee et al. |
| 6,297,541 | B1 | * | 10/2001 | Ema et al. .................. 257/665 |
| 6,420,216 | B1 | * | 7/2002 | Clevenger et al. .......... 438/132 |

* cited by examiner

Primary Examiner—Phat X. Cao
Assistant Examiner—Theresa T. Doan

(57) ABSTRACT

A fuse structure, an integrated circuit including the structure, and methods for making the structure and (re)configuring a circuit using the fuse. The fuse structure generally includes (a) a conductive structure with at least two circuit elements electrically coupled thereto, (b) a dielectric layer over the conductive structure, and (c) a first lens over both the first dielectric layer and the conductive structure configured to at least partially focus light onto the conductive structure. The method of making the structure generally includes the steps of (1) forming a conductive structure electrically coupled to first and second circuit elements, (2) forming a dielectric layer thereover, and (3) forming a lens on or over the dielectric layer and over the conductive structure, the lens being configured to at least partially focus light onto the conductive structure. The method of (re)configuring a circuit generally includes the steps of (i) irradiating at least one lens on or near a surface of the circuit sufficient to electrically disconnect a corresponding first fuse positioned under the lens and disable a first configuration of the circuit, and (ii) irradiating at least one other lens on or near the surface of the circuit sufficient to electrically disconnect a corresponding second fuse positioned under that lens and enable a second configuration of the circuit. The structure and methods advantageously provide fuse structures having improved reliability and smaller chip area, thereby increasing the yield of the manufacturing process and the numbers of die per wafer (both gross and good).

36 Claims, 10 Drawing Sheets

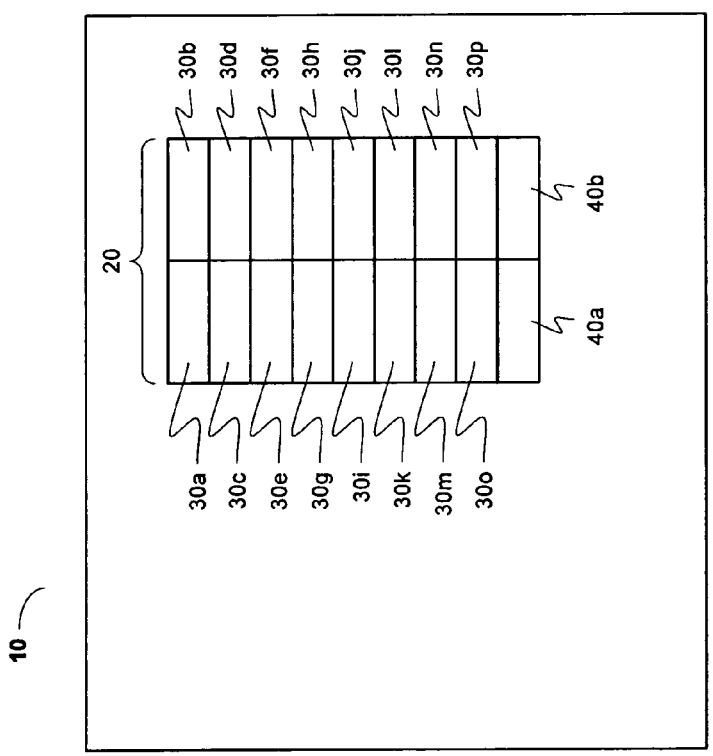

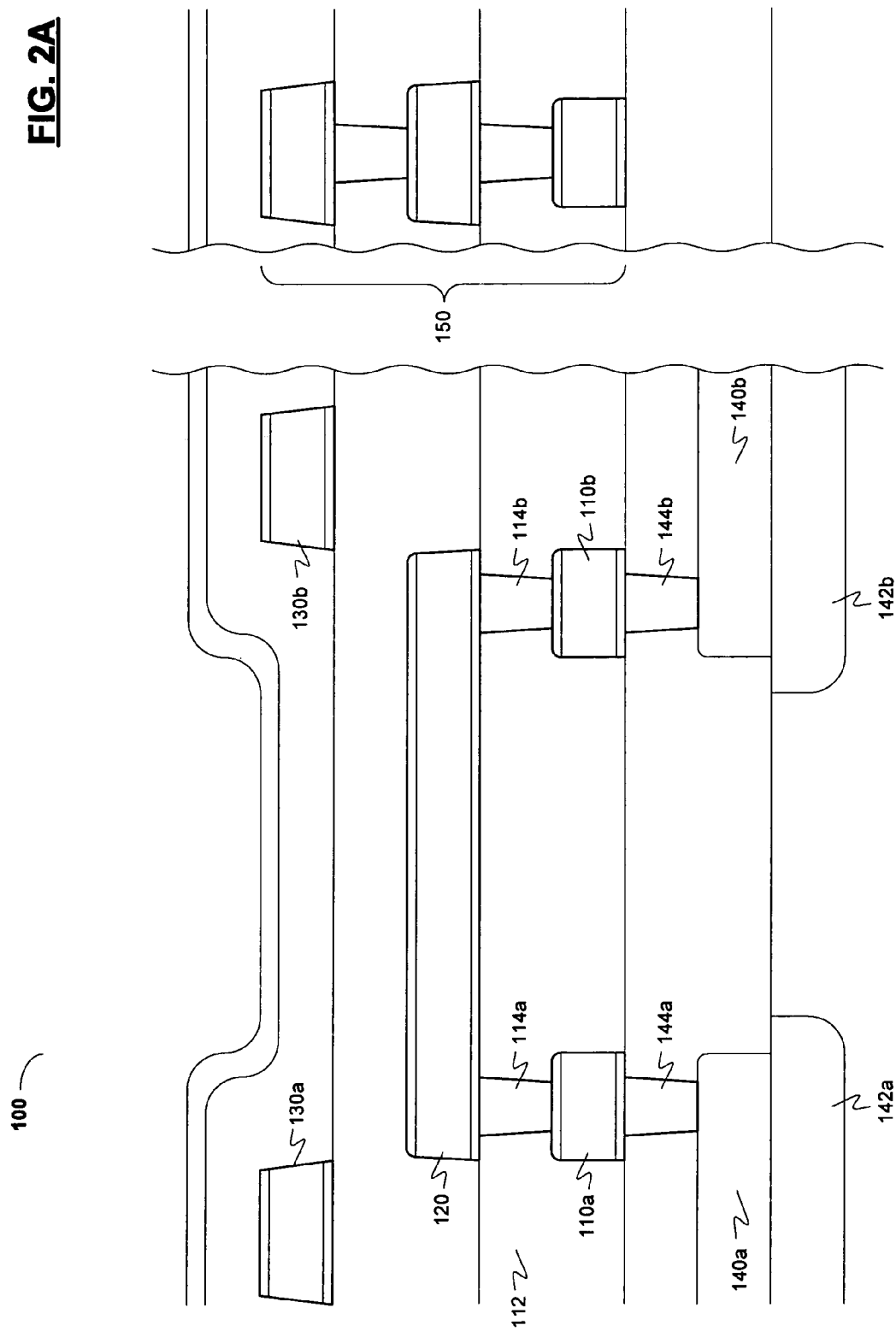

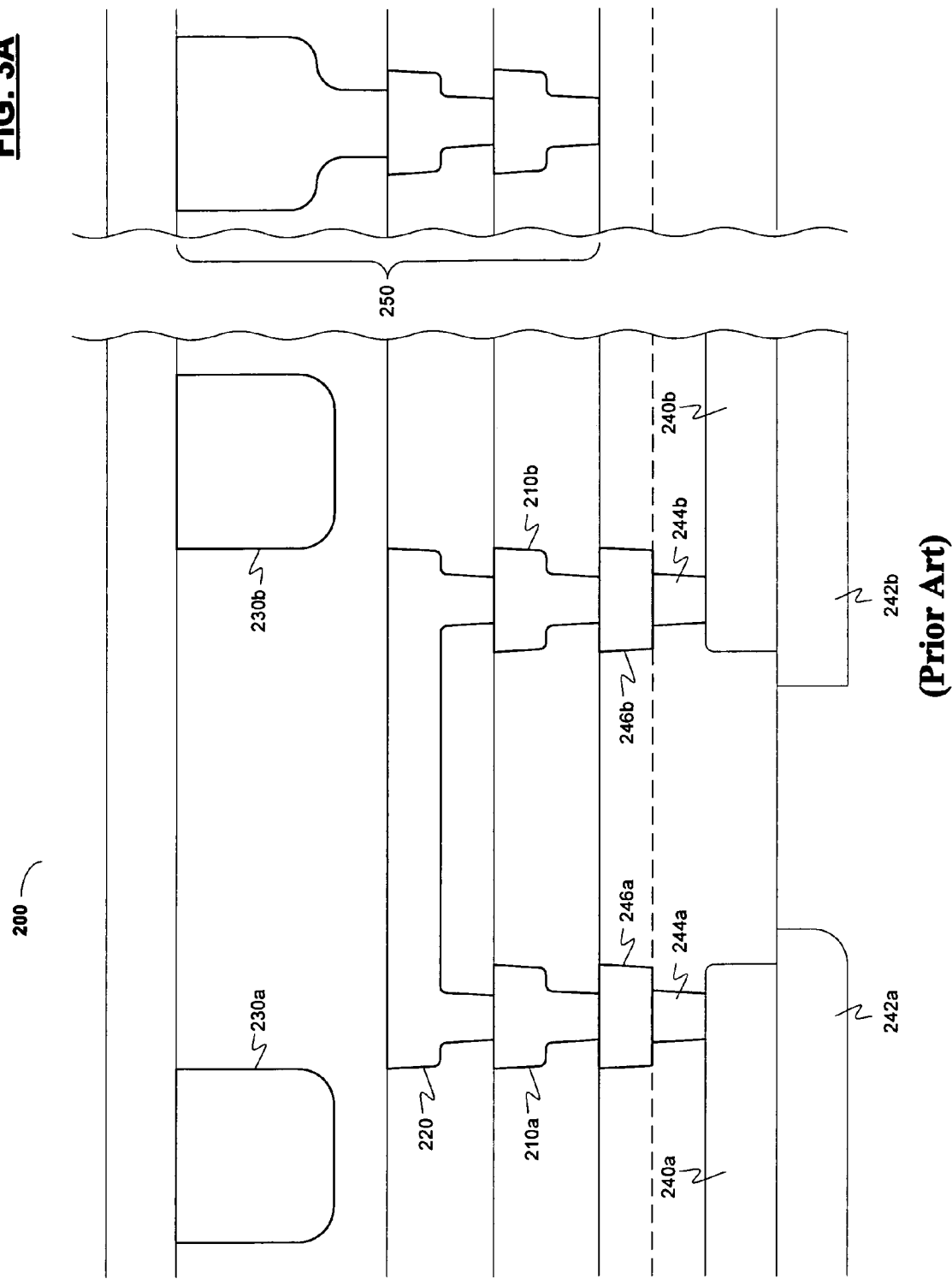

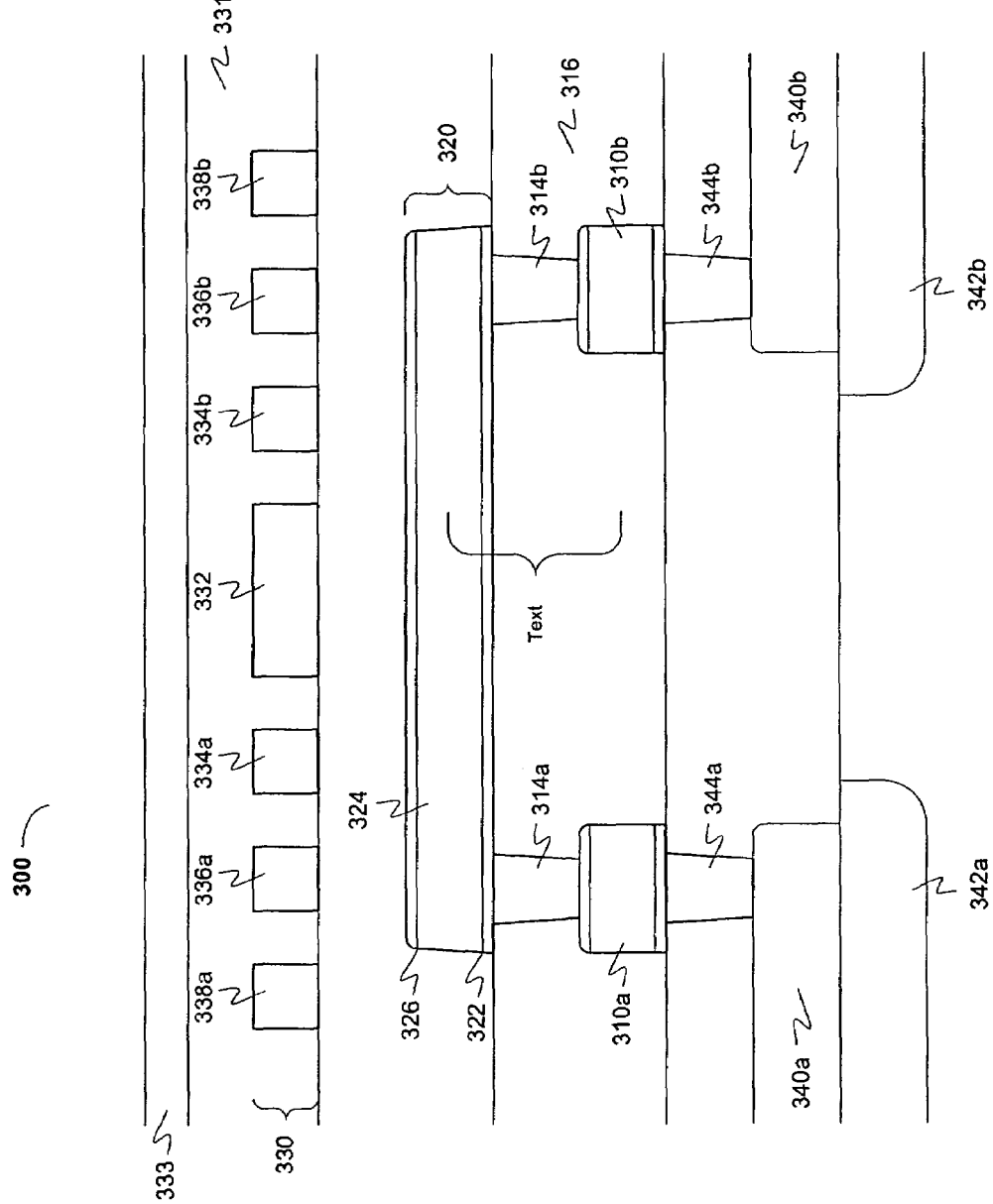

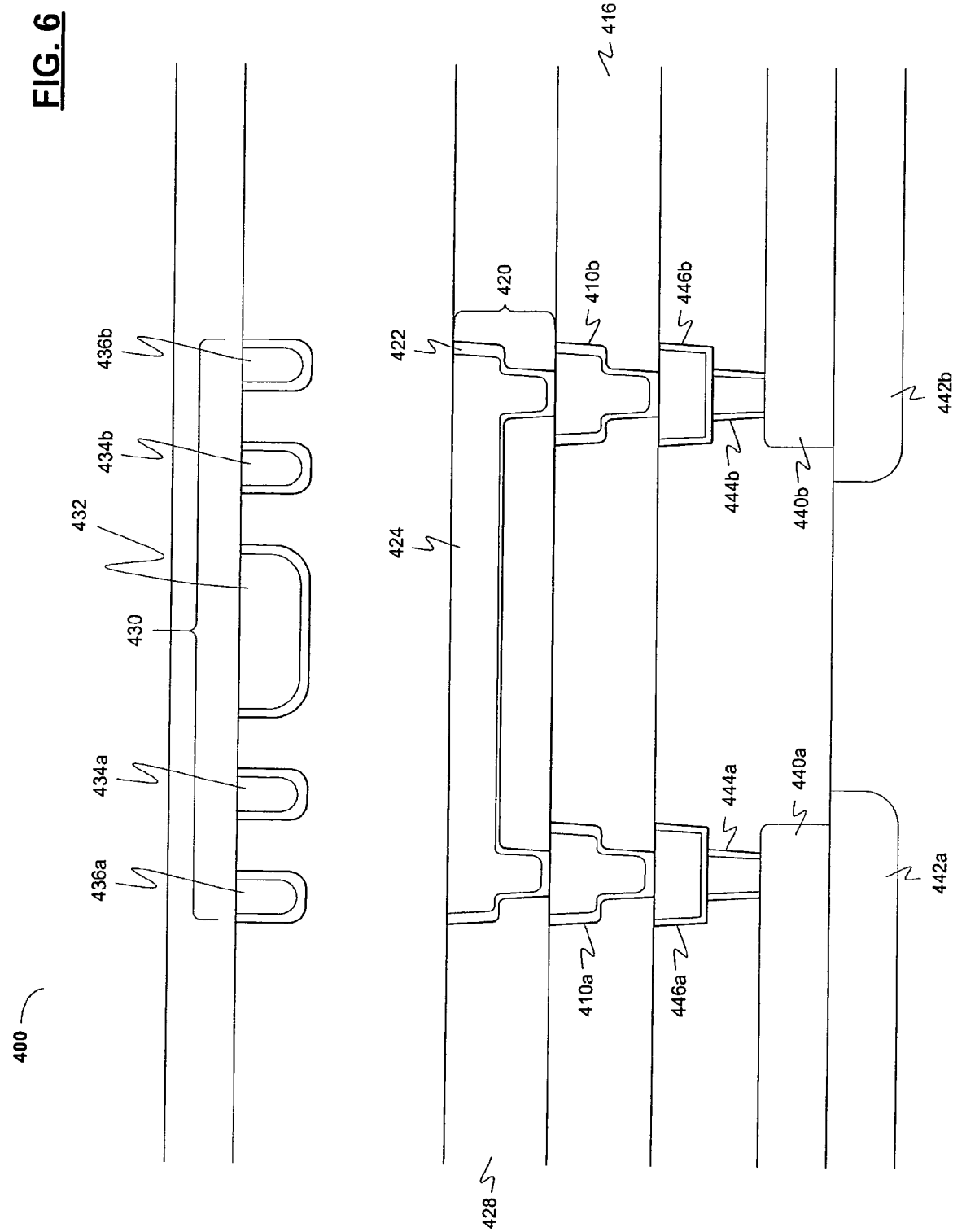

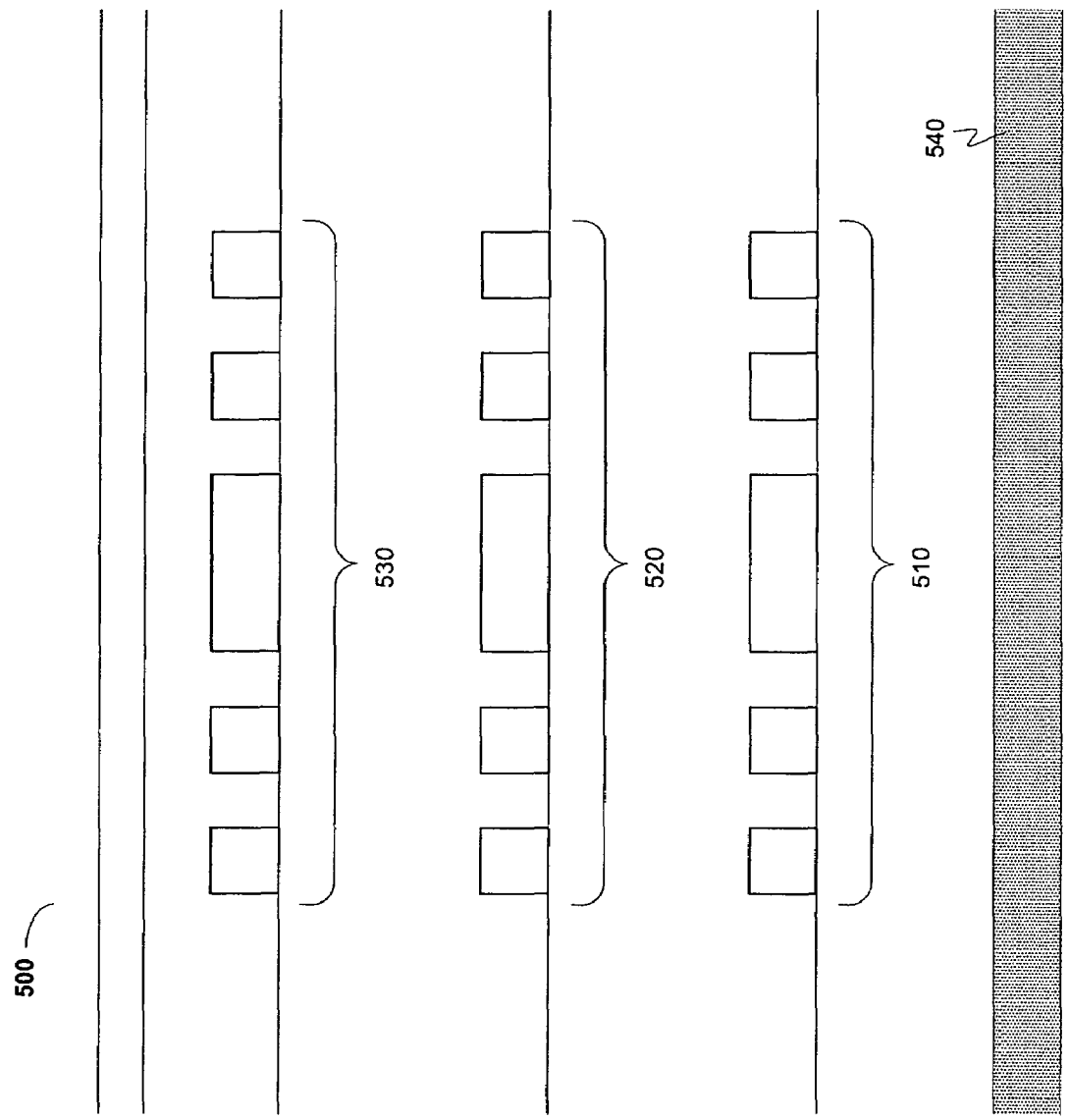

US 6,940,107 B1

FUSE STRUCTURES, METHODS OF MAKING AND USING THE SAME, AND INTEGRATED CIRCUITS INCLUDING THE SAME

FIELD OF THE INVENTION

The present invention generally relates to the field of fuses. More specifically, embodiments of the present invention pertain to fuse structures, integrated circuits including the same, and methods for making and using the same.

DISCUSSION OF THE BACKGROUND

Fuses are well known in the integrated circuit industry for configuring or reconfiguring certain kinds of circuits. For example, in large memories, one generally includes several redundant memory blocks that can be used in case a block in the main memory is defective.

FIG. 1 shows a simplified block diagram of an integrated circuit 10 with embedded memory 20. Memory 20 is made up of a plurality of main memory blocks 30a–30p and redundant memory blocks 40a and 40b. If testing memory blocks 30a–30p shows that one or two of the blocks 30a–30p are defective, the defective block(s) can be disabled (or electrically disconnected) and redundant block(s) 40a and/or 40b enabled and effectively substituted in the place of the defective block(s). Conventionally, disabling defective blocks and enabling redundant blocks is done by cutting a series of fuses on the integrated circuit (IC), either electrically or with a laser. For speed and reliability purposes, laser cutting is generally preferred over electrical disconnection.

FIG. 2A shows a cross-sectional view of a conventional, three-level-metal IC 100, where the metal lines 110a–b, 120 and 130a–b are made by a conventional photolithographic process. Lines 110a–b are considered to be on the first level of metallization (M1), line 120 is considered to be on the second level of metallization (M2), and lines 130a–b are considered to be on the third level of metallization (M3). Metal line 120 serves as the fuse that electrically connects two circuit elements, such as a power supply/voltage potential (or an input signal) and a functional block of circuitry (such as a block of memory cells), to each other. The two circuit elements are electrically connected to the fuse through first and second polysilicon lines 140a–b (generally located over shallow trench isolation structures 142a–b), first and second contacts 144a–b, M1 lines 110a–b, and M1 vias 114a–b.

FIG. 2B shows IC 100 after formation (typically by etching) of laser fuse well 135. Typically, the depth of laser fuse well 135 is carefully controlled, in order to leave a certain thickness T of oxide/dielectric material 125 over fuse 120. When one knows (1) the thicknesses of the materials overlying fuse 120 and (2) the effective wavelength of the laser light with which fuse 120 is irradiated (for cutting), then one may create or set up standing light waves in the remaining thickness T of oxide/dielectric material 125 over fuse 120 by etching the laser fuse well 135 to a relatively precise depth.

While not wishing to be bound to any particular theory, it is believed that when the fuse 120 is sufficiently irradiated, upper layer 122 absorbs some percentage of the light and heats up, along with the underlying bulk metal 124. The heated metal stresses the oxide/dielectric material 125 over fuse 120 (e.g., within thickness T), which eventually cracks and breaks when the stress placed thereon from metal thermal expansion forces exceeds the maximum strain of the oxide/dielectric material 125 over fuse 120 along thickness T. This typically opens a hole in the oxide/dielectric material 125 overlying fuse 120, and as the fuse 120 continues to absorb light from the laser, it continues to heat up, eventually vaporizing the remaining irradiated metal in fuse 120 to electrically disconnect the two circuit elements from one another.

Of course, opening a hole in an exposed surface of an IC introduces a risk of environmental contaminants, such as atmospheric oxygen, water vapor and ozone, getting into the IC and reacting with electrically functional circuit elements, such as metal lines. Also, due to variations in the thicknesses of the dielectric layers over fuse 120 and tolerances in the etching process that forms well 135, one generally applies more power than is necessary to sever the typical fuse 120 in order to ensure that one severs the worst-case fuse 120 (i.e., the fuse with the greatest thickness and the most overlying dielectric material). Sometimes, application of a little too much power (e.g., to a fuse having a relatively small thickness and a relatively thin overlying oxide in the well) can cause cracks to form in the oxide/dielectric material 112 underlying the fuse 120 as well. As a result, a guard ring 150 is generally formed in the metal layers around fuse 120 (the fuse 120 is connected to circuit elements via polysilicon lines 140a–b) to protect other circuit structures from such contamination.

However, in some cases, the physical damage from laser cutting a fuse is sufficient to render the chip defective. For example, if one has a process in which the yield of making perfectly functional memory blocks is 98%, and the laser cutting success rate is 99.9%, for a design requiring 16 memory blocks and providing 1000 die/wafer, on average, one will discard 4 die per wafer simply because the laser cutting process fails 1 time out of 1000. In a more memory-intensive design in a more advanced process technology (e.g., where the design requires 64 memory blocks and provides 2000 die/wafer), if the functional memory block yield is the same and the laser cutting success rate increases to 99.99%, one will discard, on average, 20 die per wafer simply because the laser cutting process fails 1 time out of 10,000. As one can see, it is commercially important to maximize the laser cutting rate, and reduce the possible laser repair failure mechanisms.

In all cases, guard rings consume area in the IC that does not contribute to electrical functionality. As a result, it is desirable to reduce or eliminate guard rings, structures in an IC that generally are not electrically functional circuitry. If one could eliminate the guard rings, one could increase the number of die per wafer by roughly the same percentage as the percentage of IC area consumed by the guard rings.

FIGS. 3A and 3B show a similar approach to making and using fuses where the metal processing technology is based on the well-known "damascene" metallization. Damascene processes are often used in semiconductor process technologies of 0.15 µm or less, and are nearly exclusively used for copper metallization. Some of the best-known commercial semiconductor process technologies that employ damascene metallization have six or more layers of metal, where the uppermost layer or two are composed primarily of copper.

FIG. 3A shows an IC 200 having four layers of damascene metal, M1 lines 246a and 246b, M2 lines 210a and 210b, M3 line 220, and M4 lines 230a–b. In one implementation, M4 lines 230a–b are composed primarily of copper, while M1 lines 246a and 246b, M2 lines 210a and 210b and M3 line 220 may be primarily composed of copper or aluminum (and if composed primarily of aluminum, capped by an antireflective and/or anti-hillock coating composed primarily of a transition metal, alloy or compound, such as titanium, titanium nitride, titanium-tungsten alloy or a combination thereof). Metal line 220 serves as the fuse that electrically connects two circuit elements to each other. The two circuit elements are electrically connected to the fuse 220 through first and second polysilicon lines 240a–b (generally located over shallow trench isolation structures 242a–b), first and second contacts 244a–b, M1 lines 246a–b, and M2 lines 210a–b. The "vias" between the M2/M3 metal lines and the underlying conductive structures are formed at the same time as the M2/M3 metal lines and are thus continuous therewith, but the via holes are etched separately from the trenches for the metal lines. Consequently, the process forming the structures in IC 200 is known as "dual damascene" metallization.

FIG. 3B shows IC 200 after forming laser fuse well 235. Similar to the case in FIG. 2B, one tries to control the depth of laser fuse well 235 as carefully as possible, in order to leave a known thickness T of oxide/dielectric material 225 over fuse 220. What complicates the "damascene" metal embodiment relative to the photolithographic metal embodiment are the thicknesses of the oxide/dielectric materials overlying fuse 220, which are typically on the order of 3–4 microns (3000–4000 nm). It can be quite challenging to consistently and/or reliably leave a known thickness T of less than 500 or 600 nm (about the wavelength or half-wavelength of the emitted laser light) over fuse 220, given the variations in process conditions that form IC 200 and laser fuse well 235. In addition, the process of severing the fuse leaves a hole in the upper surface of IC 200, just like in IC 100, thereby necessitating guard ring 250. Consequently, existing laser fuse technology has a number of drawbacks and/or areas where improvements can be made.

A need therefore exists for a more reliable method for (re)configuring a circuit using fuses and a method for making more compact (smaller IC area) fuses.

SUMMARY OF THE INVENTION

Embodiments of the present invention relate to a structure for disconnecting circuit elements, an integrated circuit including the structure, and methods for making and (re)configuring a circuit using the structure. The structure generally comprises (a) a conductive structure with at least two circuit elements electrically coupled thereto, (b) a dielectric layer over the conductive structure, and (c) a first lens over both the first dielectric layer and the conductive structure configured to at least partially focus light onto the conductive structure. The method of making the structure generally comprises the steps of (1) forming a conductive structure electrically coupled to first and second circuit elements, (2) forming a dielectric layer thereover, and (3) forming a lens on or over the dielectric layer and over the conductive structure, the lens being configured to at least partially focus light onto the conductive structure. The method of (re)configuring a circuit generally comprises the steps of (i) irradiating at least one lens on or near a surface of the circuit sufficient to electrically disconnect a corresponding first fuse positioned under the lens and disable a first configuration of the circuit, and (ii) irradiating at least one other lens on or near the surface of the circuit sufficient to electrically disconnect a corresponding second fuse positioned under that lens and enable a second configuration of the circuit.

The present invention advantageously provides fuse structures having improved reliability and smaller chip area, thereby increasing the yield of the manufacturing process and the numbers of die per wafer (both gross and good). These and other advantages of the present invention will become readily apparent from the detailed description of preferred embodiments below.

BRIEF DESCRIPTION OF THE DRAWINGS

FIG. 1 is a block diagram showing a conventional integrated circuit (IC) with a memory array having redundant memory blocks.

FIGS. 2A and 2B show a conventional approach to making and cutting a photolithographically patterned fuse, before forming a laser fuse well (FIG. 2A) and after (FIG. 2B).

FIGS. 3A and 3B show a conventional approach to making and cutting a fuse using damascene process technology, before forming a laser fuse well (FIG. 3A) and after (FIG. 3B).

FIG. 4 is a cross-sectional view of an embodiment of the present fuse structure.

FIG. 6 is a cross-sectional view of a second embodiment of the present fuse structure.

FIG. 7 is a cross-sectional view of a third embodiment of the present fuse structure.

DETAILED DESCRIPTION OF THE PREFERRED EMBODIMENTS

Figure 2B:
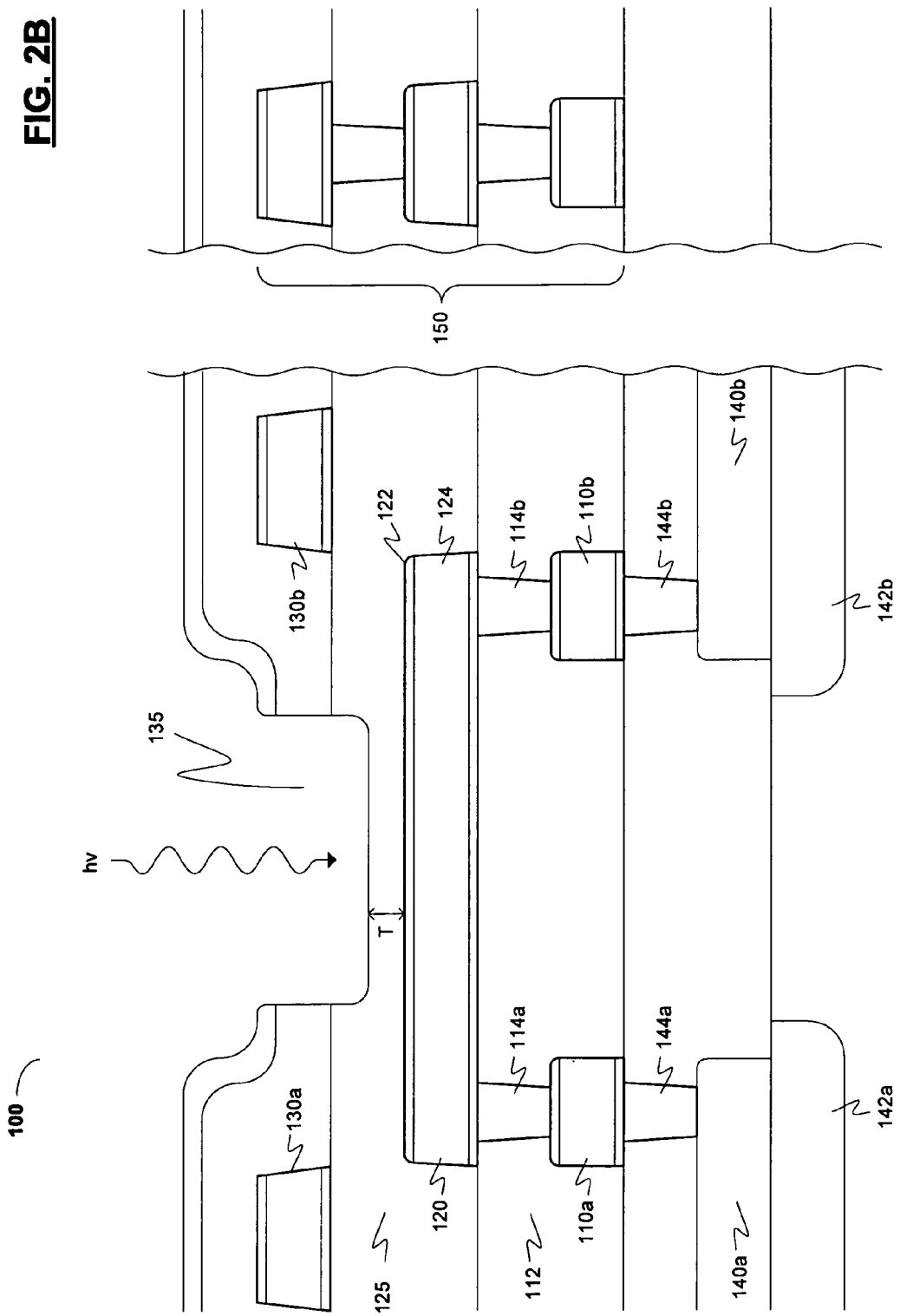
Figure 3B:
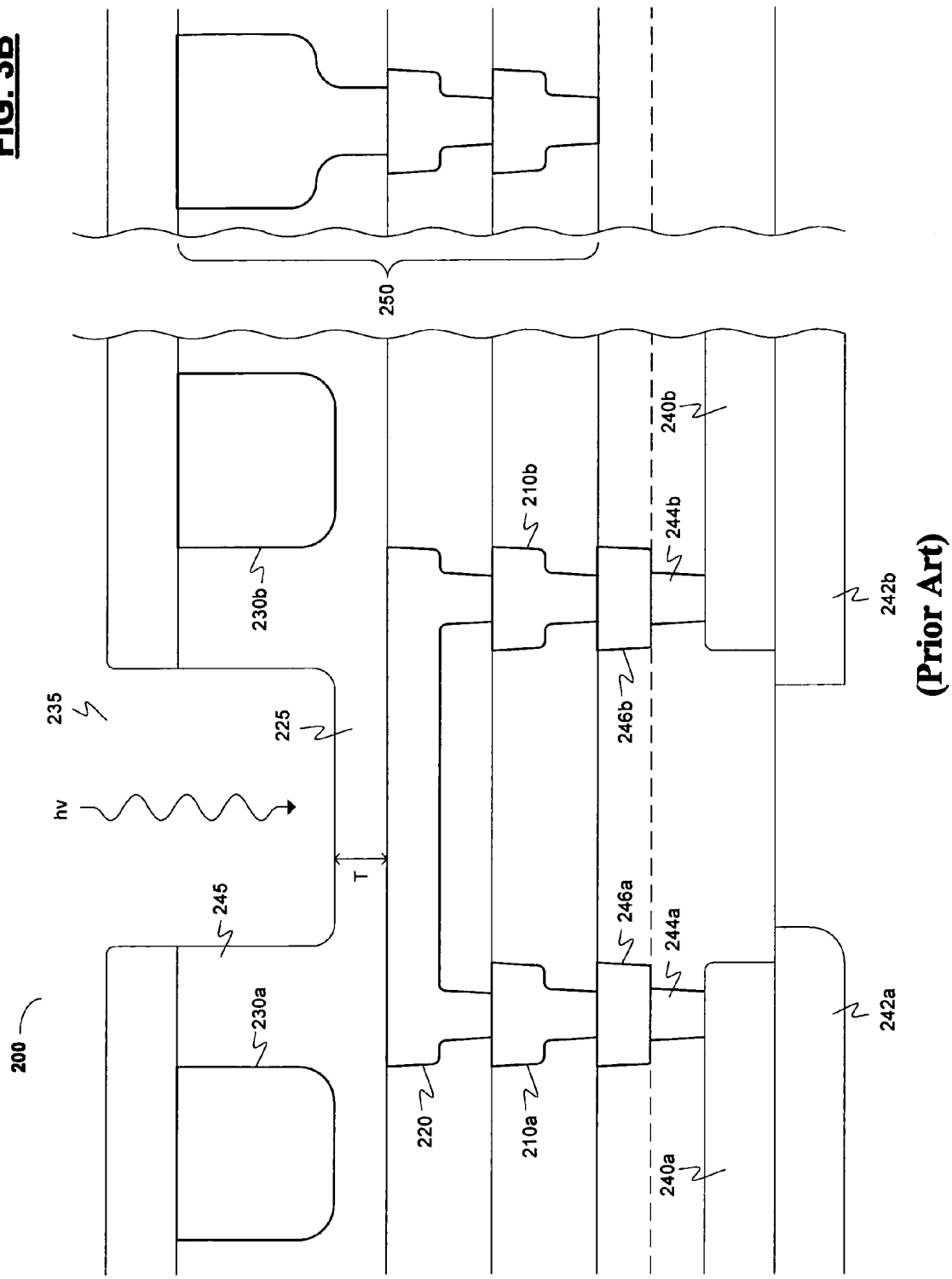

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "signal," "bus," "line" and "trace" may be used interchangeably herein, but are generally given their art-recognized meanings. Also, for convenience and simplicity, the terms "data," "data stream," "waveform" and "information" are generally used interchangeably, as may the terms "connected to," "coupled with," "coupled to," and "in communication with" (any one of which may refer to a direct and/or indirect relationship between two or more elements so connected, coupled, or in communication), but these terms are also generally given their art-recognized meanings.

The present invention concerns a structure for disconnecting circuit elements, and methods of making and using the same. The structure generally comprises (a) a conductive structure with at least two circuit elements electrically coupled thereto, (b) a dielectric layer over the conductive structure, and (c) a first lens over both the first dielectric layer and the conductive structure configured to at least partially focus light onto the conductive structure.

A further aspect of the invention concerns a method of making a structure for disconnecting circuit elements, generally comprising the steps of (1) forming a conductive structure electrically coupled to first and second circuit elements, (2) forming a dielectric layer thereover, and (3) forming a lens on or over the dielectric layer and over the conductive structure, the lens being configured to at least partially focus light onto the conductive structure.

An even further aspect of the invention concerns a method of (re)configuring a circuit, generally comprising the steps of (i) irradiating at least one lens on or near a surface of the circuit sufficient to electrically disconnect a corresponding first fuse positioned under the lens and disable a first configuration of the circuit; and (ii) irradiating at least one other lens on or near the surface of the circuit sufficient to electrically disconnect a corresponding second fuse positioned under that lens and enable a second configuration of the circuit.

The invention, in its various aspects, will be explained in greater detail below with regard to exemplary embodiments.

Exemplary Fuse Structures

In one aspect, the present invention relates to a structure configured to disconnect circuit elements, comprising (a) a conductive structure with at least two circuit elements electrically coupled thereto, (b) a dielectric layer over the conductive structure, and (c) a first lens over both the first dielectric layer and the conductive structure configured to at least partially focus light onto the conductive structure. The conductive structure absorbs light having a known or predetermined wavelength with a minimum threshold efficiency, to enable it to be severed by a laser emitting light at that wavelength. In one embodiment, the minimum threshold efficiency is a light absorption efficiency that is sufficiently high that the conductive structure is able to convert the absorbed light to sufficient thermal energy to create an electrical disconnection under the irradiation conditions used. As a result, the dielectric layer should be substantially transparent to the known or predetermined wavelength of light, and the first lens should be substantially opaque to the known or predetermined wavelength of light. Furthermore, the conductive structure, in one embodiment, is substantially horizontal.

The present fuse structure thus includes and/or provides (1) a means for electrically disconnecting first and second elements of a circuit upon absorbing a minimum threshold energy of light having a predetermined or known wavelength, and/or (2) a means for at least partially focusing such light onto the electrical disconnection means, where the means for at least partially focusing light is substantially opaque to the wavelength of light.

FIG. 4 shows a cross-sectional view of a first exemplary embodiment 300, including horizontal fuse 320 and lens 330. The fuse 320 generally comprises a metal or alloy. In one implementation, the metal or alloy consists essentially of aluminum, alone or with up to about 4 wt. % copper and/or up to about 1 wt. % silicon (preferably aluminum with about 0.5–2 wt. % copper). Fuse 320 provides electrical communications between (or electrically connects) first and second circuit elements (not shown, but generally, as described above with reference to FIGS. 2A–2B) through first and second polysilicon lines 340a–b (generally located over shallow trench isolation structures 342a–b), first and second contacts 344a–b, M1 lines 310a–b, and M1 vias 314a–b.

Fuse 320 generally comprises three layers of material, a liner or undercoating 322, a bulk conductor 324, and an overcoating 326. Liner 322 is conventional, and generally serves as a barrier between M1 oxide/dielectric layer 316 and bulk conductor 324, and it may improve adhesion of bulk conductor 324 to M1 oxide/dielectric layer 316. When bulk conductor 324 is composed primarily of aluminum, liner 322 is generally composed of a refractory material such as titanium, titanium nitride, titanium-tungsten alloy or a combination thereof. Similar to the structure of FIGS. 2A–2B, overcoating 326 generally serves as an antireflective and/or anti-hillock coating, and may be composed primarily of a transition metal, alloy or compound (such as titanium, titanium nitride, titanium-tungsten alloy or a combination thereof). Although liner 322 and overcoating 326 may be composed of the same material, they are not necessarily the same. Thus, the fuse may comprises a bulk layer consisting essentially of the first metal or alloy and an upper layer consisting essentially of another metal or alloy, where the metal or alloy of the upper layer absorbs the wavelength of laser light at a greater efficiency than the first metal or alloy.

Lens 330 comprises center structure or element 332, first peripheral structures or elements 334a–b and optional second and third peripheral structures or elements 336a–b and 338a–b, respectively. The lens structures 332, 334a–b, and (when present) 336a–b and 338a–b are covered or sealed by a first dielectric layer 331 and (optionally) a second dielectric layer 333. The dielectric layers are conventional, layer 331 generally comprising a conventional oxide material and layer 333 generally comprising a conventional nitride or oxynitride material, both of which are substantially transparent to the wavelengths of light conventionally used in commercially available laser repair equipment. Thus, the fuse may further comprise a second dielectric layer on or over the lens (or means for insulating the lens), the second dielectric layer being substantially transparent to the first wavelength of light.

The metal lines and other metallization structures in IC 300 are generally formed by conventional photolithographic processing (e.g., depositing one or more layers of metal and/or other conductive material, depositing photoresist thereon, irradiating the photoresist through a mask, developing the irradiated photoresist, etching the exposed metal, and removing the remaining photoresist to leave a patterned layer of metallization). Advantageously, the lens structures 332, 334a–b, 336a–b and 338a–b can be formed at the same time and from the same materials as the uppermost layer of metal (in IC 300, the third layer of metal M3). Thus, the lens may comprise a second metal or alloy the same as or different from the first metal or alloy of fuse 320. In the embodiment of FIG. 4, the second metal/alloy is preferably the same as the first metal or alloy (which is the bulk conductor 324 in the three-layer metal fuse).

One can even design the dimensions and inter-structure spacings of lens structures 332, 334a–b, 336a–b and 338a–b so that, after deposition of dielectric layers 331 and/or 333, the lens functions as (and thus comprises) a fresnel lens, although other lens types and structures (such as a collimating lens, a diffractive lens, a refractive lens, etc.) are certainly suitable for use in the present invention.

Figure 5B:
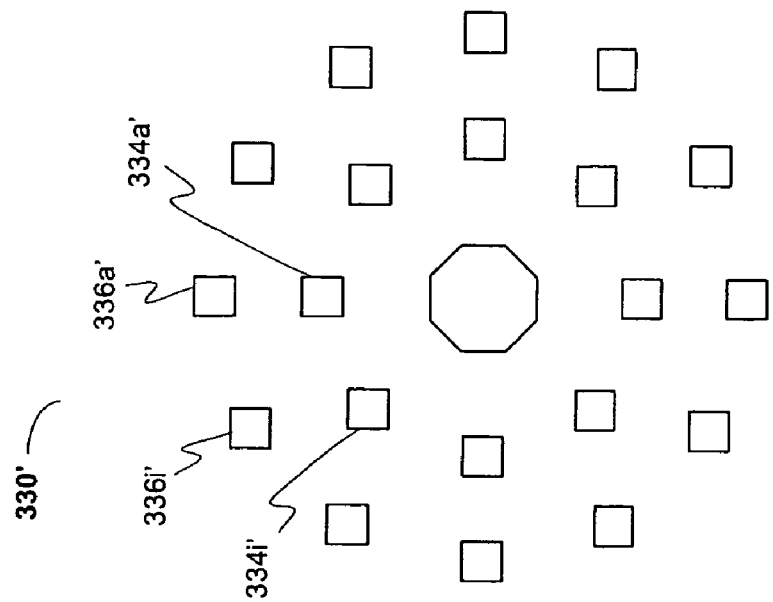
FIGS. 5A–5D are top-down views of various embodiments of the fuse structure of FIG. 4.
Figure 5A:
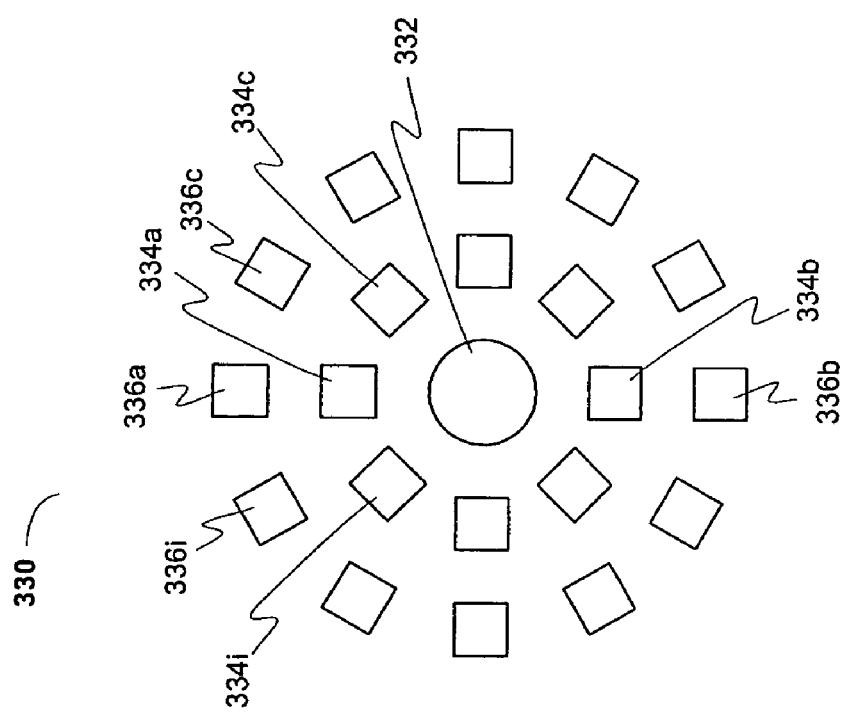

FIGS. 5A–5D show top-down views of four embodiments of lens 330, omitting the overlying dielectric layer(s) and the third, outermost "ring" of peripheral elements 338a–b for clarity. Referring to FIG. 5A, lens 330 includes central element 332, a first plurality of peripheral elements 334a–i and a second plurality of peripheral elements 336a–i. Notably, the central element 332 is larger than each of the peripheral elements 334a–336i along at least two dimensions (in this case, the two dimensions are the "xy" plane of the page).

In the embodiment of FIG. 5A, the first plurality of peripheral elements 334a–i form a regular geometric figure (in this case, a "ring" or an octagon), and each of peripheral elements 334a–i have common, substantially equal dimensions and are substantially equally spaced apart from a nearest peripheral element. For example, the distance between peripheral element 334i and peripheral element 334a is the same as the distance between peripheral element 334a and peripheral element 334c, and so forth around the ring of peripheral elements 334a–i.

Furthermore, the first plurality of peripheral elements 334a–i may be substantially equally spaced apart from the central element 332. In other words, there may be a distance between a point along the inner edge of each of peripheral elements 334a–i and the nearest point on the outer surface of central element 332 that is the same or substantially the same as the corresponding distances between the others of peripheral elements 334a–i and the nearest point on the outer surface of central element 332.

From a practical perspective, however, since almost all design software and systems lay out physical structures in squares (generally having an area as small as possible in a given system), central structure 332 may have a shape other than circular, such as square, rectangular, oval (a result of optical proximity effects on a laid-out rectangle for which such effects are not corrected), cross, square with a series of rectangles with a common circumferential length and a common center point or origin overlaid along both axes of the "by" plane, etc. Similarly, peripheral elements 334a–i are not limited to square shapes as shown in FIGS. 5A–5B, but may have another shape such as circular, rectangular, oval, cross, etc. Furthermore, the orientation of peripheral elements 334a–i is not limited to that of a ring or a regular geometric figure, but may have first and second surfaces parallel with corresponding first and second surfaces of others of the peripheral elements 334a–i (and perhaps all of the other peripheral elements 334a–i). For example, in the square peripheral element example 330' shown in FIG. 5B, each of peripheral elements 334a'–334i' has first, second, third and fourth surfaces parallel with corresponding first, second, third and fourth surfaces of all of the other peripheral elements 334a'–334i'. Furthermore, each of peripheral elements 336a'–336i' has first, second, third and fourth surfaces parallel with corresponding first, second, third and fourth surfaces of all of the other peripheral elements 336a'–336i' and/or 334a'–334i'.

Thus, the lens may further comprise a second plurality of peripheral elements surrounding the first plurality of peripheral elements. The number of peripheral elements in the second plurality may be the same as or different from the number of peripheral elements in the first plurality. For example, when the number of peripheral elements in the second plurality is the same as the first plurality, the average or effective thickness of the "ring" defined by the second plurality of peripheral elements is less than the average or effective thickness of the "ring" defined by the first plurality of peripheral elements, contributing to the structure and/or function of a fresnel lens. On the other hand, the number of peripheral elements in the second plurality may be greater than the first plurality, in some embodiments by a factor of at least 1.5 times.

Figure 5D:
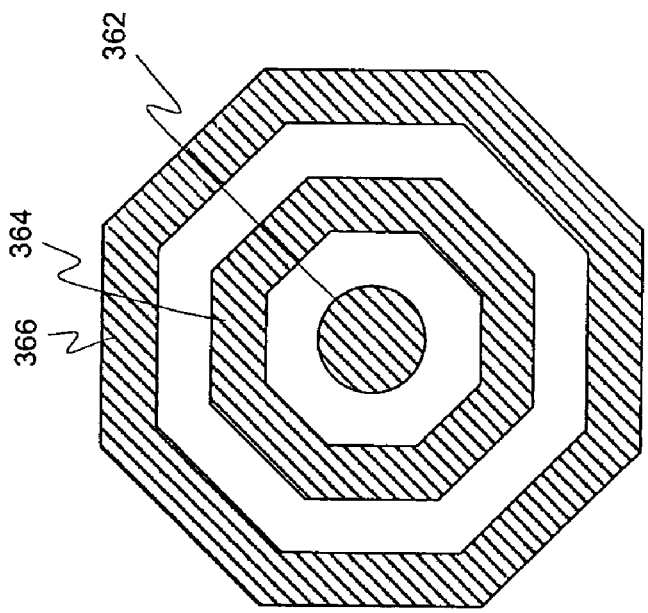
Figure 5C:
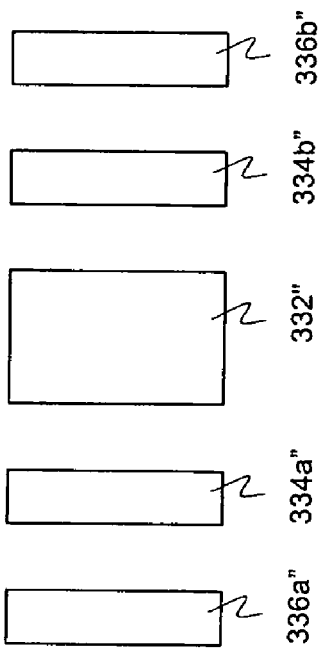

Referring now to FIG. 5C, lens 330" includes central element 332", a first plurality of peripheral elements 334a" and 334b" and a second plurality of peripheral elements 336a" and 336b". Notably, the central element 332" is larger than each of the peripheral elements 334a" and 336b" along one dimension (in this case, the dimension is one in the "xy" plane of the page). The embodiment of FIG. 5C may be considered a "one-dimensional" lens pattern, in which each of peripheral elements 334a", 334b", 336a" and 336b" has first, second, third and fourth surfaces parallel with corresponding first, second, third and fourth surfaces of central element 332" and all of the other peripheral elements 334a"–336b".

In the embodiment of FIG. 5D, lens 360 includes central element 362, a first peripheral ring element 364 and a second peripheral ring element 366 in what may be considered a "two-dimensional" arrangement. The peripheral ring elements may form a regular geometric figure (such as a square, rectangle, circle, or as in this case, an octagon), and each of peripheral ring elements 364 and 366 may have substantially equal widths and are substantially equally spaced apart from a nearest element (i.e., center element and/or peripheral ring element). For example, the distance between peripheral ring element 366 and peripheral ring element 364 may be the same as the distance between peripheral ring element 364 and central element 362. The orientation of peripheral ring elements 334–336 is not limited to that of an octagon or other regular geometric figure, but may have first and second surfaces parallel with corresponding first and second surfaces of the other peripheral ring element(s) (and perhaps all of the other peripheral ring elements, if there is more than one).

Thus, the lens may further comprise one or more second peripheral elements outside the first peripheral element(s) relative to a central element. The number of second peripheral elements may be the same as or different from the number of first peripheral elements (although it may be the same), and the length and/or width of the second peripheral element(s) may be the same as or different from the length and/or width of the first peripheral element(s) (although the height will generally be the same). For example, when the width of the second peripheral element(s) differs from the first peripheral element(s), the arrangement contributes to the structure and/or function of a fresnel lens. On the other hand, the number of second peripheral elements may be greater than the number of first peripheral elements, in some embodiments by a factor of 2, 4, or more times. For example, referring to FIG. 5C, either or both of second peripheral elements 336a″ and 336b″ may be replaced with a plurality of square or rectangular spaced elements, in substantially the same area (or "footprint") as the corresponding second peripheral element(s) 336a″ and/or 336b″. Such an arrangement is also believed to contribute to the structure and/or function of a fresnel lens. When the lens further comprises a third plurality of peripheral elements surrounding the second peripheral element(s), the number of peripheral elements in the third plurality may be the same as or different from the number of second peripheral elements, but when different, the number of peripheral elements in the third plurality may be at least 2 times the number of first and/or second peripheral elements.

FIG. 6 shows a second embodiment 400 of the present structure, including horizontal fuse 420 and lens 430. The fuse 420 generally comprises aluminum, an aluminum alloy (as described above with respect to FIG. 4) or copper, and in various implementations, horizontal fuse 420 consists essentially of aluminum, one of the above-mentioned aluminum alloys, or copper. Fuse 420 provides electrical communication between first and second circuit elements through first and second polysilicon lines 440a–b (generally located over shallow trench isolation structures 442a–b), first and second contacts 444a–b, M1 lines 446a–b and M2 lines 410a–b.

Fuse 420 may comprise two layers of material, a liner or undercoating 422, and a bulk conductor 424. Liner 422 is conventional, and generally serves as a barrier between M3 oxide/dielectric layer 428 and bulk conductor 424, and it may improve adhesion of bulk conductor 424 to M3 oxide/dielectric layer 428. When bulk conductor 424 is composed primarily of aluminum, liner 422 is generally composed of a refractory material such as titanium, titanium nitride, titanium-tungsten alloy or a combination thereof. When bulk conductor 424 is composed primarily of copper, liner 422 is generally composed of a refractory material such as tantalum, tantalum nitride, titanium nitride, or a combination thereof. Thus, the fuse may comprise a bulk layer consisting essentially of the first metal or alloy and a lower layer consisting essentially of another metal or alloy.

Like the lens 330 of FIGS. 4 and 5A–B, lens 430 comprises center element 432, first peripheral elements 434a–b and optional second peripheral elements 436a–b, respectively. The lens structures 432, 434a–b, and (when present) 436a–b are covered or sealed by a dielectric layer 435. The dielectric layer is conventional, and generally comprises a conventional oxide, nitride and/or oxynitride material, all of which are substantially transparent to the wavelengths of light conventionally used in commercially available laser repair equipment.

The metal lines and other metallization structures in IC 400 are generally formed by conventional dual damascene processing (e.g., depositing one or more layers of oxide and/or other dielectric material, depositing photoresist thereon, irradiating the photoresist through a mask, developing the irradiated photoresist, etching the exposed dielectric to form via holes or trenches, removing the remaining photoresist, repeating the photoresist deposition/irradiation/development-oxide etch-photoresist removal steps to form the other of the via holes or trenches, depositing metal, and removing the metal outside the trenches and via holes [generally by chemical-mechanical polishing] to leave a layer of metallization). Advantageously, the lens structures 432, 434a–b, and 436a–b can be formed at the same time (at least during trench etch; the lens area may be masked off by photoresist during via etch) and from the same materials as the uppermost layer of metal (in IC 400, the fourth layer of metal M4). Alternatively, if one desires lens structures 432, 434a–b, and 436a–b to have a different thickness than the uppermost layer of metal, one may pattern and etch the area(s) corresponding to lens 430 separately from the remainder of the uppermost layer of metal.

FIG. 7 shows a third embodiment of the present fuse, comprising a plurality of lenses. In IC 500, laser light is irradiated onto first lens 530 (which may be similar in structure to lens 330 of FIG. 4), which at least partially focuses the light onto second lens 520, which at least partially focuses the light onto third lens 510, which then at least partially focuses the light onto horizontal fuse 540. In such an embodiment, the conductive structure 540 comprises silicon (which may be in the form of polysilicon, amorphous silicon, or a polysilicon-transition metal silicide bilayer). Advantageously, lens 530 may be formed at the same time and using the same materials as M3 metal lines, lens 520 may be formed at the same time and using the same materials as M2 metal lines, and lens 510 may be formed at the same time and using the same materials as M1 metal lines. This embodiment enables use of a highly light-absorbent material (silicon and/or a transition metal silicide) as a fuse, while at the same time, retaining all of the advantages of the single-lens embodiments of FIGS. 4 and 6.

Thus, the present fuse may further comprise a second lens under the first lens and over the conductive structure, the second lens being substantially opaque to the first wavelength of light and being configured to (i) receive the at least partially focused light from the first lens and (ii) further focus the light onto the conductive fuse. Alternatively, the fuse further comprises a second means for at least partially focusing light having the first wavelength onto the means for electrically disconnecting circuit elements from one another.

An Exemplary Integrated Circuit

A further aspect of the invention relates to an integrated circuit, comprising the present fuse and a first circuit in electrical communication with the first fuse, configured to be disabled when the first fuse is electrically disconnected. As described above, the integrated circuit advantageously does not include a guard ring around the present fuse. Since the present fuse generally does not open a hole in the IC surface, a dedicated structure for protecting other circuitry in the IC from exposure to potential sources of damage or contamination after the fuse is irradiated is not necessary. Thus, the nearest conductive structure to the fuse in the same level of metallization may be one that provides a signal or electric potential (power supply) for one or more electronic functions in the IC.

The integrated circuit may have one or more of a number of functions, such as data storage (e.g., memory), data processing (e.g., logic), signal processing, timing, etc. Thus, in various embodiments, the first circuit in electrical communication with the fuse may comprises a row, column or block of memory; a signal path including at least one switch or switching element; or a data processing circuit including at least one logic block or logic gate.

The integrated circuit may comprise two or more substantially identical fuses (or sets of fuses), and a second circuit in electrical communication with the second fuse (or set of fuses), configured to be enabled when the second fuse is electrically disconnected. In such an embodiment, the second circuit provides a function that the first circuit is designed to provide (but which may be defective in the first circuit). Typically, a design will use a first plurality (i.e., two or more) of fuses for disconnecting a first (defective) circuit and a second plurality of fuses for enabling a second (redundant and/or replacement) circuit.

Exemplary Methods of Making a Fuse

The present invention further relates to method of making a structure configured to disconnect circuit elements, comprising the steps of: (1) forming a conductive structure electrically coupled to first and second circuit elements, (2) forming a dielectric layer thereover, and (3) forming a lens on or over the dielectric layer and over the conductive structure, the lens being configured to at least partially focus light onto the conductive structure. As described above for the fuse, the first conductive structure absorbs a known or predetermined wavelength of light with a minimum threshold efficiency, while the dielectric layer is substantially transparent and the lens is substantially opaque to that wavelength of light, to enable laser cutting of the fuse material. Because the present method advantageously uses existing, conventional photolithographic and/or damascene process technology to form the components, a number of structures in the present fuse can be formed at the same time as other components in the IC. For example, the step of forming the conductive structure may further comprise simultaneously forming a first plurality of conductive structures, and/or the step of forming the first lens may further comprise simultaneously forming a second plurality of conductive structures. In this embodiment, either or both of the first and second plurality of conductive structures may be substantially horizontal.

As for conventional photolithographic and/or damascene process technology, the present method of making a fuse may comprise (A) depositing one or more layers of metal and/or other conductive material, depositing photoresist thereon, irradiating the photoresist through a mask, developing the irradiated photoresist, etching the exposed metal, and/or removing the remaining photoresist to leave a patterned layer of metallization; or (B) depositing one or more layers of oxide and/or other dielectric material, depositing photoresist thereon, irradiating the photoresist through a mask, developing the irradiated photoresist to expose predetermined portions of the dielectric layer(s), etching the exposed dielectric to form either via holes or trenches, removing the remaining photoresist, repeating the photoresist deposition, irradiating, developing, etching and photoresist removal steps to form the other of the via holes or trenches, optionally depositing a liner layer sufficient to thoroughly cover the exposed surfaces of the IC, depositing metal into the via holes and trenches sufficiently to fill the via holes and trenches, and/or removing the metal outside the trenches and via holes (generally by chemical-mechanical polishing) to leave a layer of metallization. Thus, the present method of making a fuse may further comprise the step(s) of (i) forming a second dielectric layer on or over the first lens, (ii) forming a second lens over the second dielectric layer, the second lens being substantially opaque to the first wavelength of light and being configured to at least partially focus light having the first wavelength onto the first lens; (iii) forming the first and second circuit elements before and/or simultaneously with forming the conductive structure; (iv) forming electrical contacts to the first and second circuit elements before forming the conductive structure.

Exemplary Methods of (Re)configuring a Circuit Using a Fuse

In a further embodiment, the invention relates to a method of (re)configuring a circuit, comprising the steps of: (i) irradiating at least one lens on or near a surface of the circuit sufficient to electrically disconnect a corresponding first fuse positioned under the lens and disable a first configuration of the circuit; and (ii) irradiating at least one other lens on or near the surface of the circuit sufficient to electrically disconnect a corresponding second fuse positioned under that lens and enable a second configuration of the circuit. As detailed above, each of the lenses are substantially opaque to a known or predetermined wavelength of light and are configured to at least partially focus light of that wavelength onto the corresponding fuses, and each of the fuses are electrically coupled to the corresponding first and second circuit elements and are configured to absorb the wavelength of light with a minimum threshold efficiency. Although the lens may be made from substantially the same material as the fuse, the lens does not absorb sufficient light to adversely affect its light-focusing function (and thus is substantially opaque) when the light (typically from a laser) is focused on the fuse (e.g., at a depth corresponding to the position of the fuse).

The first configuration is typically the native configuration as manufactured and/or prior to laser repair, and the second configuration is typically the repaired configuration (e.g., with input signals that would have been transmitted to the first circuit rerouted to the second circuit, and outputs that would have been transmitted by the first circuit provided instead by the second circuit). However, fuses are also commonly used to configure an integrated circuit. In such a case, one may design a circuit to have a plurality of different configurations, and one of the configurations can be selected by cutting one or more fuses corresponding to the selected configuration. For example, one may design a memory such that one of a plurality of predetermined depths, widths and/or densities is selectable; one may disable a function (such as parity checking) in a data communications device; one may select the state of a read-only memory cell (a fuse being a type of ROM); etc. When the circuit has an operable default configuration, the circuit may be reconfigured by disconnecting one or more of the circuits or circuit elements in the default configuration, and/or connecting (and/or enabling) one or more replacement circuits or circuit elements in the new configuration.

As described above, the circuit to be disconnected is generally contained within an integrated circuit. Many IC designs employ groups of two or more fuses to either disconnect a defective circuit to be repaired or enable a replacement circuit for the disconnected circuit. Thus, the present method of (re)configuring a circuit may comprise (i) irradiating a plurality of first lenses sufficient to electrically disconnect a corresponding plurality of first fuses and disable the first configuration of the circuit, and/or (ii) irradiating a plurality of second lenses sufficient to electrically disconnect a corresponding plurality of second fuses and enable the second configuration of the circuit.

CONCLUSION/SUMMARY

Thus, the present invention provides a structure for disconnecting circuit elements, an integrated circuit including the structure, and methods for making and (re)configuring a circuit using the structure. The structure generally comprises (a) a conductive structure with at least two circuit elements electrically coupled thereto, (b) a dielectric layer over the conductive structure, and (c) a first lens over both the first dielectric layer and the conductive structure configured to at least partially focus light onto the conductive structure. The method of making the structure generally comprises the steps of (1) forming a conductive structure electrically coupled to first and second circuit elements, (2) forming a dielectric layer thereover, and (3) forming a lens on or over the dielectric layer and over the conductive structure, the lens being configured to at least partially focus light onto the conductive structure. The method of (re)configuring a circuit generally comprises the steps of (i) irradiating at least one lens on or near a surface of the circuit sufficient to electrically disconnect a corresponding first fuse positioned under the lens and disable a first configuration of the circuit, and (ii) irradiating at least one other lens on or near the surface of the circuit sufficient to electrically disconnect a corresponding second fuse positioned under that lens and enable a second configuration of the circuit. The present invention advantageously provides fuse structures having improved reliability and smaller chip area, thereby increasing the yield of the manufacturing process and the numbers of die per wafer (both gross and good).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A structure configured to disconnect circuit elements, comprising:
   a) a conductive structure with first and second circuit elements electrically coupled thereto, said conductive structure absorbing a first wavelength of light with a minimum threshold efficiency;
   b) a first dielectric layer over said conductive structure, said dielectric layer being substantially transparent to said first wavelength of light; and
   c) a first lens over both said first dielectric layer and said conductive structure, said first lens being substantially opaque to said first wavelength of light and being configured to at least partially focus light having said first wavelength onto said conductive structure.

2. The structure of claim 1, further comprising a second dielectric layer on or over said lens, said second dielectric layer being substantially transparent to said first wavelength of light.

3. The structure of claim 1, wherein said lens comprises a fresnel lens.

4. The structure of claim 1, wherein said lens comprises a central element and a first peripheral element adjacent to said central element.

5. The structure of claim 4, wherein said first peripheral element surrounds said central element.

6. The structure of claim 4, wherein said lens comprises a first plurality of peripheral elements adjacent to said central element.

7. The structure of claim 6, wherein said first plurality of peripheral elements comprises first and second peripheral elements adjacent to opposed surfaces of said central element.

8. The structure of claim 6, wherein said first plurality of peripheral elements have common, substantially equal dimensions and are substantially equally spaced apart from a nearest peripheral element.

9. The structure of claim 8, wherein said first plurality of peripheral elements are further substantially equally spaced apart from said central element.

10. The structure of claim 4, wherein said central element is larger than each of said first peripheral element along at least one dimension.

11. The structure of claim 6, further comprising a second plurality of peripheral elements adjacent to said first plurality of peripheral elements.

12. The structure of claim 1, further comprising a second lens under said first lens and over said conductive structure, said second lens being substantially opaque to said first wavelength of light and being configured to (i) receive said at least partially focused light from said first lens and (ii) further focus said light onto said conductive structure.

13. The structure of claim 12, wherein said conductive structure comprises silicon.

14. The structure of claim 1, wherein said conductive structure comprises a first metal or alloy.

15. The structure of claim 14, wherein said first lens comprises a second metal or alloy, said second metal or alloy being the same as or different from said first metal or alloy.

16. The structure of claim 15, wherein said conductive structure comprises a bulk layer consisting essentially of said first metal or alloy and an upper layer consisting essentially of a third metal or alloy, said third metal or alloy absorbing said first wavelength of light at a greater efficiency than said first metal or alloy, and said second metal or alloy is the same as said first metal or alloy.

17. The fuse of claim 1, wherein said conductive structure is substantially horizontal.

18. An integrated circuit, comprising:
   a) a first structure according to claim 1; and
   b) a first circuit in electrical communication with said first structure and comprising one of said first and second circuit elements, configured to be disabled when said conductive structure is electrically disconnected.

19. The integrated circuit of claim 18, wherein said first circuit in electrical communication with said first structure comprises a row, column or block of memory.

20. The integrated circuit of claim 18, further comprising:
   a) a second structure configured to disconnect third and fourth circuit elements, substantially identical to said first structure, and b) a second circuit in electrical communication with said second fuse and comprising one of said third and fourth circuit elements, configured to be enabled when said second fuse is electrically disconnected.

21. The integrated circuit of claim 20, wherein said second circuit provides a function that said first circuit is designed to provide.

22. The integrated circuit of claim 18, wherein said integrated circuit does not include a guard ring around said fuse.

23. A structure configured to disconnect circuit elements, comprising:
- a) means for electrically disconnecting first and second circuit elements, said means for electrically disconnecting absorbing a first wavelength of light with a minimum threshold efficiency;
- b) a first means for insulating said means for electrically disconnecting, said means for insulating being substantially transparent to said first wavelength of light; and
- c) a first means for at least partially focusing light having said first wavelength onto said means for electrically disconnecting, said means for at least partially focusing light being substantially opaque to said first wavelength of light.

24. The structure of claim 23, further comprising a second means for insulating said first means for at least partially focusing light, said second means for insulating being substantially transparent to said first wavelength of light.

25. The structure of claim 23, wherein said first means for at least partially focusing light comprises a lens.

26. The structure of claim 25, wherein said lens comprises a fresnel lens.

27. The structure of claim 23, further comprising a second means for at least partially focusing light having said first wavelength onto said means for electrically disconnecting, said second means for at least partially focusing light being (i) configured to receive said at least partially focused light from said first means for at least partially focusing light and (ii) substantially opaque to said first wavelength of light.

28. The structure of claim 27, wherein said means for electrically disconnecting comprises silicon.

29. The structure of claim 23, wherein said means for electrically disconnecting comprises a first metal or alloy.

30. The structure of claim 29, wherein said first means for at least partially focusing light comprises a second metal or alloy, said second metal or alloy being the same as or different from said first metal or alloy.

31. The structure of claim 30, wherein said means for electrically disconnecting comprises a bulk layer consisting essentially of said first metal or alloy and an upper layer consisting essentially of a third metal or alloy, said third metal or alloy absorbing said first wavelength of light at a greater efficiency than said first metal or alloy, and said second metal or alloy is the same as said first metal or alloy.

32. An integrated circuit, comprising:
- a) a first structure according to claim 23; and
- b) a first circuit in electrical communication with said first fuse and comprising one of said first and second circuit elements, configured to be disabled when said first fuse is electrically disconnected.

33. The integrated circuit of claim 32, wherein said first circuit comprises a means for storing data.

34. The integrated circuit of claim 32, further comprising:
- a) a second structure configured to disconnect third and fourth circuit elements substantially identical to said first structure, and
- b) a second circuit in electrical communication with said second structure and comprising one of said third and fourth circuit elements, configured to be enabled when said second fuse is electrically disconnected.

35. The integrated circuit of claim 34, wherein said second circuit comprises a means for providing an electrical function that said first circuit is designed to provide.

36. The integrated circuit of claim 32, wherein said integrated circuit does not include a means for protecting other circuitry in said integrated circuit from exposure to potential sources of damage or contamination after said fuse is irradiated.

\* \* \* \* \*